(12) United States Patent
Itoh (10) Patent No.: US 6,743,477 B2
(45) Date of Patent: Jun. 1, 2004

(54) METHOD FOR PARTIALLY PLATING ON A BASE

(75) Inventor: Ryoh Itoh, Kamakura (JP)

(73) Assignee: Sumitomo Shoji Plastics Co., Ltd., Tokyo (JP)

( * ) Notice: Subject to any disclaimer, the term of this patent is extended or adjusted under 35 U.S.C. 154(b) by 167 days.

(21) Appl. No.: 09/735,931

(22) Filed: Dec. 14, 2000

(65) Prior Publication Data

US 2001/0019739 A1 Sep. 6, 2001

(30) Foreign Application Priority Data

Dec. 21, 1999 (JP) .......................................... 11-363336

(51) Int. Cl.$^7$ ................................................ B05D 5/12
(52) U.S. Cl. ...................... 427/282; 427/96; 427/301; 427/304; 427/307; 427/443.1
(58) Field of Search ............................ 427/307, 96, 98, 427/282, 301, 304, 305, 306, 437, 443.1

(56) References Cited

U.S. PATENT DOCUMENTS

| | | | | |
|---|---|---|---|---|
| 4,940,608 A | * | 7/1990 | Kawagishi et al. | 427/259 |
| 5,388,754 A | * | 2/1995 | Grosclaude et al. | 228/118 |
| 5,989,787 A | * | 11/1999 | Kanoh et al. | 430/324 |

* cited by examiner

*Primary Examiner*—Brian K. Talbot
(74) *Attorney, Agent, or Firm*—Kanesaka & Takeuchi (57) ABSTRACT

A base of synthetic resins or other materials is partially plated. The base includes not only a single base but an assembly with a number of chip bases for producing electronic and electric parts such as printed circuit board, lead frame insert molded circuit parts, etc. A method for partially plating a base by the use of a plating catalyst includes a coating process to coat a surface to be plated or not to be plated by means of a coating material selected from a water soluble polymer or hydrolyzable polymer either before or after a catalyst applying process to soak a container containing the base in a plating catalyst bath.

6 Claims, 9 Drawing Sheets

METHOD FOR PARTIALLY PLATING ON A BASE

BACKGROUND OF THE INVENTION

1. Field of the Invention

This invention relates to a method for partially plating on a base of synthetic resins or other materials including not only a single base but an assembly thereof comprising a number of chip bases, and more particularly relates to a method for partially plating on bases to be used for producing electronic and electric parts such as printed circuit board, lead frame insert molded circuit parts, etc.

2. Description of the Related Art

There has been known how to partially plate on a synthetic resin base or molded article as in the following;

(1) according to a conventional method, the surface of a molded article is roughed, for example, by etching, followed by addition of a Pd- or Pt-catalyst and application of resist thereon, except a portion to be plated, by a silk screening or dispenser coating, and is then subjected to a plating process, the resist being finally removed therefrom, and (2) according to the other conventional method, a molded article which has been roughed and catalyzed as described above is inserted in a mold, coated with an insulating material such as plastics or gum by injecting the material into the mold while leaving a portion to be plated in an uncoated condition and is then subjected to a plating process, the thus coated material being removed, if necessary. (See, "Plastics Seikeikakou no Fukugouka Gijutsu" (Combined Technology of Plastics Molding), CMC Co., Ltd., pp. 260–275; JP-A No. 7-316825; JP-A No. 63-4,092 and Registered JP No. 2,592,243).

In the above mentioned method (1), however, it is necessary to conduct a resist hardening process by heat-drying, etc. after the resist is applied. Further, an organic solvent such as methylene chloride should be used to remove the resist after the plating process. Such an organic solvent is considered as an origin substance, like chlorofluorocarbon (CFC), which causes the failure of ozone layer and would bring about an increase in skin tumor and cataract or undesirable change in ecosystem of plants, plankton, etc. when a large quantity of solvent is wasted.

In the other method (2), on the other hand, a plating liquid tends to soak into the boundary between the coating material and the molded article due to poor adhesivity of the material, which causes a decrease in the dimensional accuracy of the product. In addition, the same trouble would occur similarly as in the case of the resist when the coating material is removed.

Furthermore, electrical surface resistance of the base is reduced after the plating process or the circuit is formed, because the plating catalyst is added throughout the surface of the molded article.

SUMMARY OF THE INVENTION

Accordingly, it is an object of the present invention to provide a method for partially plating on a base made of a synthetic resin or other material which does not comprise resist application, hardening and removal processes so that no environmental problem due to organic solvents would occur while shortening the total process, electronic and electrical parts thus plated having outstanding dimensional accuracy, remarkable conductivity and high quality.

Using a water soluble polymer or hydrolyzable polymer as a coating material for coating a portion not to be plated, the above mentioned object can be achieved by;

[1] a method for partially plating on a base by the use of a plating catalyst comprising a coating process to coat a surface to be plated or not to be plated by means of a coating material selected from a water soluble polymer or hydrolyzable polymer either before or after a catalyst applying process to soak a container containing bases in a plating catalyst bath;

[2] in the above mentioned method, the base may include not only a single base but an assembly of a number of bases (the "base" hereinafter means both a single unit and an assembly thereof, unless otherwise noted);

[3] the above mentioned method preferably comprises the following processes in order
 (1) a roughing process to rough the base surface,
 (2) a coating process to partially coat the roughed surface with a coating material selected from a water soluble polymer or hydrolyzable polymer,
 (3) a catalyst applying process to apply a plating catalyst on the surface except an uncoated portion,
 (4) a coated material removing process, and
 (5) a plating process to plate on the catalyzed surface; or

[4] the above mentioned method preferably comprises the following processes in order
 (1) a coating process to partially coat a roughed surface with a coating material selected from a water soluble polymer or hydrolyzable polymer,
 (2) a roughing process to rough the base surface except a coated area,
 (3) a catalyst applying process to apply a plating catalyst on the roughed surface,
 (4) a coated material removing process, and
 (5) a plating process to plate on the catalyst applied surface; or [5] the above mentioned method preferably comprises the following processes in order
 (1) a roughing process to rough the base surface,
 (2) a catalyst applying process to apply a plating catalyst on the surface,
 (3) a coating process to partially coat the surface with a coating material selected from a water soluble polymer or hydrolyzable polymer,
 (4) a plating process to plate on the surface except an uncoated portion, and
 (5) a coated material removing process, or [6] the above mentioned method preferably comprising the following processes in order
 (1) a roughing process to rough the base surface,
 (2) a catalyst applying process to apply a plating catalyst on the surface,
 (3) a plating process,
 (4) a coating process to partially coat the surface with a coating material selected from a water soluble polymer or hydrolyzable polymer,
 (5) a removing process to remove a plated layer except the coated portion, and
 (6) a coated material removing process.

In the cases of the methods and, the catalyst applying process (3) and the coated material removing process (4) may be conducted at the same time. Further, the catalyst applying process (3) may be followed by a preliminary plating process.

On the other hand, in the case of the method, an additional plating process may be conducted after the coated material removing process (5).

BRIEF DESCRIPTION OF THE DRAWINGS

FIGS. 1(A) and 1(B) show a base according to an example of the present invention, wherein FIGS. 1(A) and 1(B) are a perspective view and a partially cutaway view thereof, respectively.

FIGS. 7(A)–7(C) show an assembly of FIG. 6 on which a coating material is applied, wherein FIGS. 7(A), 7(B) and 7(C) are a perspective view, a sectional illustration taken on line 7(B)–7(B) in FIG. 7(A) and a partially cutaway view of FIG. 7(B), respectively.

DETAILED DESCRIPTION

As a water soluble or hydrolyzable polymer is used as a coating material in the present invention, organic solvents are not necessary to remove the coating material. The water soluble polymer is removed with water, while the hyrolyzable one is removed with an alkaline or acidic solution.

When such polymers are biodegradable in nature, the coating material will be easily degraded to water and carbon dioxide owing to soil or aquatic microorganisms. Consequently, a waste treatment of such polymers after their removal from a base can be done simply without causing environmental problems.

Compared with conventional plastics or gum as a coating material, the water soluble or hydrolyzable polymer used in the present invention has higher transfer properties (nature to be molded more similarly to a mol shape) when the polymer is subjected to injection molding and, due to slow hardening speed thereof, exhibits improved interfacial adhesivity to the base (generally made of a material different from the coating material), which results in plating of high dimensional accuracy and partially plated products of high quality.

Further, as the water soluble or hydrolyzable polymer is finally removed from the plated products, a coating configuration thereof is not influenced by shapes or sizes of final products and can be designed exclusively for convenience of plating to contribute to downsizing of the products. As the shapes or sizes of final products are not restricted by configurations or dimensions of the coating material during the plating process, it is possible to coat the base quite freely so that circuit electrode of three-dimensional patterns is formed on the base. This increases the degree of freedom of designing chip parts such as circuit electrode and, in addition, various kinds of electronic and electric parts integrated with the base, while downsizing of these parts is promoted.

Further, according to the present invention, insulating resistance of the products is increased after the surface is plated or, more precisely, the circuit is formed because of absence of plating catalyst on the unplated surface, thereby improving electric properties thereof.

[Base]

There may be used a substrate comprising resins such as thermoplastic and thermosetting resins, and inorganic materials such as ceramics and glass as a base of the present invention.

Preferably, the base includes an aromatic liquid crystal polymer, polysulfone, polyether polysulfone, polyarylsulfone, polyether imido, polyester, acrylonitrile-butadiene-stylene copolymer, polyamide, modified polyphenylene oxide, norbornene resin, phenolic resin, epoxy resin and the like.

More preferably, the base is a polyester liquid crystal polymer having thermal resistance and thermal expansion coefficient close to metals within a wide range of temperature and stretch properties as well as thermal cycle test results similar to metal film.

The base may be added with a filler such as glass fiber, potassium pyrrolinate, wollastnite, calcium carbonate, barium titanate, carbon fiber, silica fiber, barium sulfate and the like.

The base may be a plate type or variously shaped into molded types, and may also be a single type or highly integrated assembly of plural bases.

[Coating Material]

A coating material used in the present invention includes the above mentioned water soluble or hydrolyzable polymer which can be formed into a certain configuration on the base, and preferably a biodegradable polymer from an environmental standpoint.

In particular, the coating material includes polyvinyl alcohol represented by the formula I, modified polyvinyl alcohol represented by the formula II and polylactate represented by the formula III, as well as starch, microbially fermented aliphatic polyester, condensation product of aliphatic polyester-dicarbonic acid and diglycol, aliphatic caprolactone resin, cellulose acetate resin and the like. More preferably, the coating material is hydrolyzable polylactate or a mixture or copolymer (random or block copolymer) thereof with aliphatic polyester which comprises polylactate as a predominant constituent.

Polyvinyl alcohol:

(I)

Modified polyvinyl alcohol:

(II)

Polylactate:

(III)

Polylactate is considered as a favorable coating material of the present invention because of the following factors:

(i) Hydrolyzable and also biodegradable properties thereof;

(ii) Improved plating accuracy without occurrence of inconvenience such as adsorption of catalyst to the coating material and swelling of the material itself, which is observed by water soluble polymers including polyvinyl alcohol, modified polyvinyl alcohol, etc. during the catalyst applying process;

(iii) Accurate and secure catalyzation of plating without occurrence of inconvenience such as adsorption and swelling as described above even after a longer catalyst applying process; and (iv) Easy removal of catalyst during the coating material removing process as will be described later.

The above mentioned polylactate may be used independently or as a mixture or random- or block copolymer thereof with one or more than two aliphatic polyester and, if necessary, mixed with general purpose resin additives such as alkali decomposition promoter, organic and inorganic filler, plastisizer, wetting agent, UV-light absorber, antioxidant, lubricant, colorant and the like. The aliphatic polyester used herein includes those polyesters consisting of polyhydroxycarboxylic acid, hydroxycarboxylic acid or aliphatic polyol and aliphatic polybasic acid; and random- or block copolymer consisting of two or more than two monomer components selected from hydroxycarboxylic acid and aliphatic polyol and two or more than two monomer components selected from aliphatic polybasic acid.

The aliphatic polyester is mixed or copolymerized in the coating material in an amount of about 1 to 10% by weight of the thus formed mixture or copolymer. An alkali decomposition promoter is mixed in an amount of about 1 to 100%, preferably 5 to 80% and more preferably 10 to 60% by weight of the mixture, while the other additives are suitably mixed in an amount of 1 to 5% by weight of the mixture.

Weight-average molecular weight of the polylactate is preferably 10,000 to 400,000, while that of the aliphatic polyester is 10,000 to 500,000, preferably 30,000 to 400,000 and more pfererably 50,000 to 300,000 in a mixture with the polylactate, and 10,000 to 500,000, preferably 30,000 to 400,000 and more preferably 50,000 to 300,000 in a copolymer therewith.

A hydroxycarboxylic acid used in the present invention includes glycolic acid, L-lactic acid, D-lactic acid, D/L-lactic acid, 3-hydroxybutyric acid, 4-hydroxybtyric acid, 3-hydroxyvaleric acid, 5-hydroxyvaleric acid, 6-hydroxycaproic acid and the like, which may be used independently or as a mixture thereof.

An aliphatic polyol used in the present invention includes ethylene glycol, diethylene glycol, triethylene glycol, polyethylene glycol, propylene glycole, dipropylene glycol, 1,3-butanediol, 1,4-butanediol, 3-methyl1,5-pentanediol, 1,6-hexanediol, 1,9-nonanediol, neopentyl glycol, 1,4-cyclohexanedimethanol, 1,4-benzenedimethanol and the like, which may be used independently or as a mixture thereof.

An aliphatic polybasic acid used in the present invention includes succinic acid, oxalic acid, malonic acid, glutaric acid, adipic acid, pimelic acid, sberic acid, azelaic acid, cebacic acid, undecane dicarboxylic acid, dodecane dicarboxylic acid, phenylsuccinic acid, 1,4-phenylene diacetic acid and the like, which may be used independently or as a mixture thereof.

An alkali decomposition promoter used in the present invention includes starch; polyalkylene glycol such as polyvinylalcohol, polyetylene glycol, polypropylene glycol or polyoxytetramethylene glycol; hydrophilic highpolymer compounds such as polyamino acid; alkali-hydolyzable compounds such as succinic anhydride and polysuccinimide; and the like, which may be used independently or as a mixture thereof. Preferably polyalkylene glycol, more preferably polyethylene glycol is used because of its improved dispersibility in or compatibility with polylactate or aliphatic polyester and less bleed-out properties thereof.

The base is partially coated with the above mentioned coating material to form a coated configuration by, for example, injection-, extrusion-, compression-, cast-, transfer molding, and other molding processes. Injection molding is preferable above all because coating of a desired portion of the base surface and injection of the coating material are conducted at the same time thereby the base being used as a portion of mold.

In order to remove the coating material, water for water soluble polymers and an aqueous alkali or acid (various inorganic acid) solution for hydrolyzable polymers are used, respectively.

Removal of the coating material and catalyzing may also be done at the same time in the catalyst applying process as will be described later.

When the coating material is water soluble polymers, it is generally preferable to remove the coating material by soaking it in water at about 25 to 95° C. for 2 to 35 hours.

When the coating material is hydrolyzable polymers and especially polylactate, it is preferable to remove the material by soaking it in an aqueous alkaline (such as NaOH, KOH, etc.) solution ranging in concentration of about 2 to 15% by weight at about 25 to 70° C. for about 1 to 120 minutes. As not only the coating material but a plating catalyst might be removed from the base in such an alkaline solution at higher temperature and concentration than the condition described above, the removing process should be carried out within these ranges of temperature and concentration.

[Base Surface Roughing]

The base surface may be roughed by a conventional method, for example, by an etching process.

There are two types of etching, wet and dry, which may be chosen depending on a material of the base, etc.

In a dry type, etching is conducted by means of plasma, gases, etc.

On the other hand, in wet type etching, the base is coated with or soaked in an aqueous alkali metal hydroxide such as NaOH and KOH; an aqueous solution of metal alcoholate such as alcoholic sodium and alcoholic potassium; or an organic solvent such as dimethyl-folmamide to contact the base surface with such a liquid etchant.

An etching process using an aqueous solution of NaOH, KOH, etc. is preferably conducted under a condition ranging in condensation of about 35 to 50% by weight and temperature of about 70 to 95° C.

It is also preferable to conduct another etching process for roughing the base surface by means of an aqueous solution of metal alcoholate or an organic solvent such as dimethyl-folmamide after the surface has been coated by a water soluble or hydrolyzable polymer.

The base is sometimes only swollen without roughing when an organic solvent is used. In such a case, the base may be subjected to an acid or alkali treatment after the solvent is used. Further, when the base surface is roughed after the coating process, the roughing process should be conducted under a condition in which the coating material is not completely removed, although a little removal thereof may be allowable.

It is preferable to treat the base with an acid solution such as hydrochloric acid and hydrofluoric acid after the base comes into contact with the liquid etchant in the wet etching process. The purpose of such an acid treatment is not only to neutralize the alkaline liquid etchant but also to remove a part of filler contained in the base especially from the base surface or in the vicinity thereof so as to further improve the roughing effect.

Accordingly, the acid treatment is preferably conducted under a condition of pH, temperature, time period, etc. enough to dissolve the filler.

When the base comes into contact with the liquid etchant or it is treated with an acid solution, the base may be put in a container to soak in the liquid etchant or acid solution, thereby the container being rotated or rocked. The container may be in a shape of barrel, ball or box with a number of perforations or a basket, a material thereof being synthetic resin such as polypropylene, or surface treated metal with fluororesin, etc.

[Plating Catalyst]

A plating catalyst used in the present invention (hereinafter referred to simply as catalyst) may be a conventional compound and is preferably a Pd- or Pt-catalyst, which is used, for example, as an inorganic salt thereof such as chloride.

Catalyzation, i.e., application of a plating catalyst, is conducted by adhesively applying the above mentioned inorganic salt to the base, followed by an accelerator treatment to precipitate the catalyst metal on the base surface.

In order to adhesively apply the inorganic salt to the base surface, the base allows to come into contact with an inorganic salt solution by, for example, soaking therein or coating therewith. According to the present invention, the base may be put in the container as described above to soak in the inorganic salt solution by rotating or rocking the container similarly as the roughing process.

A practical condition of plating varies depending on such factors as a material of base, metal to be plated, a material of plating catalyst, an application manner of inorganic salts. When palladium chloride is used as the catalyst in a soaking process, a plating process is exemplarily carried out under the following condition;

| Composition of catalyst salt solution: | |
|---|---|
| PdCl$_2$.2H$_2$O: | 0.1 to 0.3 g/dm$^3$ |
| SnCl$_2$.2H$_2$O: | 10 to 20 g/dm$^3$ |
| HCl: | 150 to 250 g/dm$^3$ |
| Soaking condition: | |
| temperature | 20 to 45° C. |
| time period | 1 to 10 minutes |

Besides the above mentioned hydrochloric acid as a solvent for plating catalyst solution, there may also be used an organic solvent such as methanol, ethanol, isopropyl alcohol, etc. which does not completely, but may partially dissolve the coating material of water soluble or hydrolyzable polymer.

The metal salt as a plating catalyst is adhesively applied on the base surface, then washed with water and subjected to the accelerator treatment to precipitate the plating catalyst (metal) thereon.

In a general accelerator treatment, an accelerator (promoter solution) is brought into contact with the catalyzed base by soaking in or coating with the solution, while in the present invention, a container comprising the catalyzed base is soaked in the accelerator liquid and rotated or rocked therein. According to the present invention, all of these catalyzing, water washing and accelerator treating processes are conducted while keeping the base in the same container.

An inorganic solution such as sulfuric acid, hydrochloric acid, sodium hydroxide, ammonium and the like may be used as the accelerator.

When a catalyst salt solution of the above mentioned composition is applied to the base surface by the soaking process under the condition as described above, a complex Sn$^{2+}$-Pd$^{2+}$ adhered on the base surface is hydrolyzed to precipitate Sn$^{2+}$ as Sn(OH)Cl. The thus formed Sn(OH)Cl is then dissolved by the accelerator treatment and reacted with Pd2+, which is already released from a situation as its complex, through an oxidation-reduction reaction to form metallic Pd on the base surface. The thus formed metallic Pd functions as the plating catalyst.

The accelerator treatment may be done either simultaneously with removal of the coating material or thereafter because elution of water soluble or hydrolyzable polymer as the coating material would happen to result in during the accelerator treatment. This treatment may also complete before the coating material is entirely eluted as a matter of course.

When the coating material of water soluble or hydrolyzable polymer is as thin as about 100 to 1,000 μm and preferably about 10 to 500 μm in thickness, application of the plating catalyst and removal of the coating material may be done at the same time, because complete elution of the coating material may occur during the plating catalyst applying process which comprises a series of processes including adhesion of plating catalyst such as the above mentioned complex Sn$^{2+}$- Pd$^{2+}$, water washing in which Sn(OH)Cl is precipitated due to hydrolyzation of the complex, and the accelerator treatment in which Sn(OH)Cl is dissolved and reacted through an oxidation-reduction reaction with Pd$^{2+}$ freed from its complexing situation during water washing.

In this case, the accelerator treatment is preferably carried out while keeping temperature of the promoter at about 40 to 80° C. and bringing into contact with the promoter for a time period for about 30 to 120 minutes.

Further, when the coating material is formed by injection molding in which the base is used as a part of the mold after the base surface is roughed, unevenness of the base (roughed surface) is liable to disappear due to intimate contact thereof with an injection mold. For that reason, the base is arranged in the mold to leave a slight space between the base and the mold so that the coating material is applied to the space to form fins, although such a space is an area not to be coated essentially. The coating material applied to the slight space, i.e. fins, can be eluted completely during the catalyst applying process because off considerably thin thickness thereof.

As has been described above, a simultaneous operation of the catalyst applying process and the coating material removing process is quite useful from standpoints of process effectiveness, protection of the roughed base surface, accurate practice of plating, etc.

[Plating]

There may be used conventional metalyzing methods such as electroless plating or electroplating in the present invention.

Metals to be plated on the base of the present invention include copper, tin, lead, nickel, gold and the like.

The plating process may either be conducted batchwise or all at once.

Further, a preliminary plating process may be conducted after the catalyst applying process according to conventional metalyzing methods and, in particular, the electroless plating method, while metals to be plated are the same metals used in the so-called primary plating process. The preliminary process makes the plating quality of the primary process much higher.

In addition, an after-plating process may also be conducted according to conventional metalyzing methods and, in particular, the electroless method, while metals to be plated may be either the same as or different from those metals used in the primary plating.

[Removal of Plated Materials]

Removal of plated materials may be done in any manner capable of removing the plated metals and, in general, is carried out by bringing the plated surface into contact with a solution of inorganic salt such as iron trichloride and cupric chloride through soaking or coating. According to the present invention, however, it is preferable to remove plated materials by soaking the plated base put in a container in a solution of inorganic salt while rotating or rocking similarly as the above mentioned roughing process or catalyst applying process.

(A)
[Annealing Treatment]

An annealing treatment may be done after each process of the present invention is completed. Adhesivity of the plated metal is further improved by the annealing treatment.

It is preferable to anneal the base by keeping temperature at 160 to 175° C. for 1 to 5 hours followed by gradually cooling to room temperature.

As has been described above, according to the present invention, it is possible to neglect a conventional process for applying, hardening and removing resist so that environmental problems due to organic solvents never occur and total processes can be shortened. On the other hand, the thus obtained electronic and electrical parts exhibit excellent dimensional accuracy, improved conductivity and high quality.

This invention will be further detailed in the following embodiments.

EXAMPLE 1

[Base Molding Process]

Figure 1A:
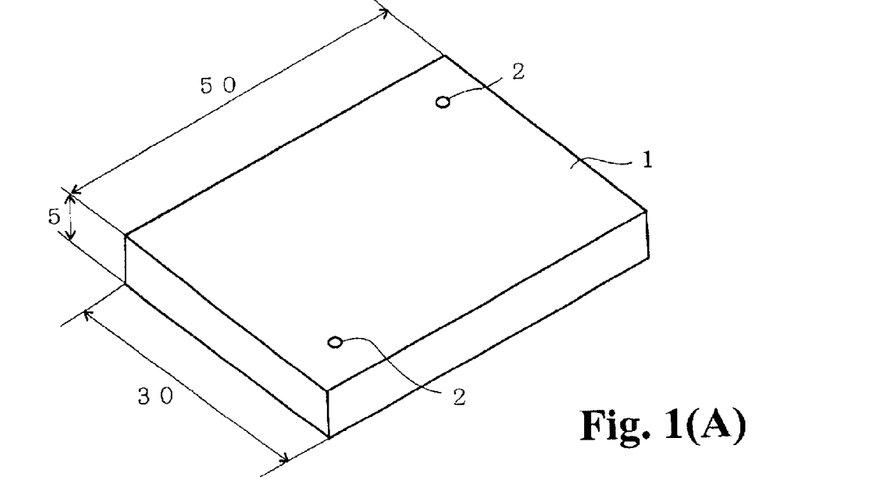
Figure 1B:
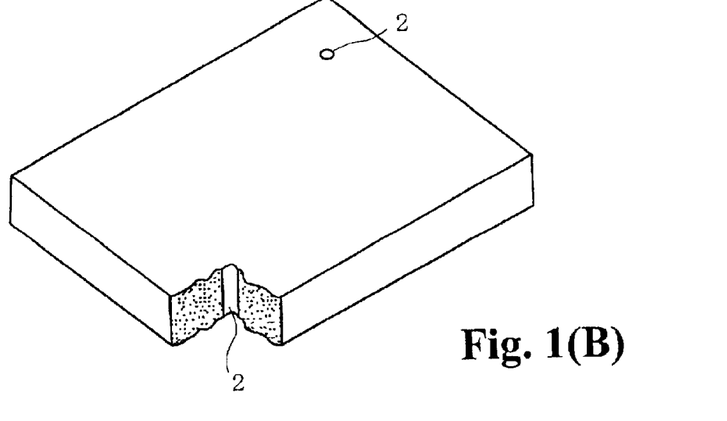

A base 1 (single body) was molded from aromatic polyester (liquid crystal polymer "VECTRA C810"®, available from CELANESE Co., Ltd.) by means of a primary mold as shown in FIG. 1 (A) (perspective view) and (B) (partially cutaway view).

Outer dimensions of the base 1 are 50×30×5 mm, while two through holes 2 are formed on the upper surface in the diagonal direction as shown in FIGS. 1(A) and 1(B).

A plurality of bases 1 was put in a perforated barrel-like container made of polypropylene and soaked in a heated degreasing solution (a 50 g/l aqueous solution of "ACE-CLEAN A220"®, available from OKUNO CHEMICAL INDUSTRIES Co., Ltd.) at 60° C. for 10 minutes while rotating the container and then washed with water to degrease them.

[Base Surface Roughing Process]

An alkaline solution prepared by dissolving 430 g of metallic Na (generally in an amount of 350 to 500 g) in 1 l of methyl alcohol was heated to 90° C., in which a plurality of degreased bases 1 kept in the barrel-like container were soaked for 40 minutes (generally for 30 to 80 minutes) while rotating to rough the surface of bases 1.

Roughed bases 1 were also obtainable when ethyl alcohol was used instead of methyl alcohol together with 430 g of metallic Na under the same condition.

When isopropyl alcohol was used instead of methyl alcohol together with 430 g of metallic Na, a plurality of degreased bases 1 kept in the barrel-like container were soaked in the thus prepared solution at 60° C. for 10 minutes and then in a chromic acid mixture comprising 22% by weight of $CrO_3$ and 54% by weight of concentrated sulfuric acid at 60° C. while rotating, respectively, to rough the base surface.

Further, when there was used an alkaline solution prepared by dissolving 400 g of NaOH (generally in an amount of 350 to 500 g) in 1 l of water, roughed bases 1 were also obtainable under the same condition as described above in the case of methyl alcohol.

[Base Coating Process]

Figure 2:
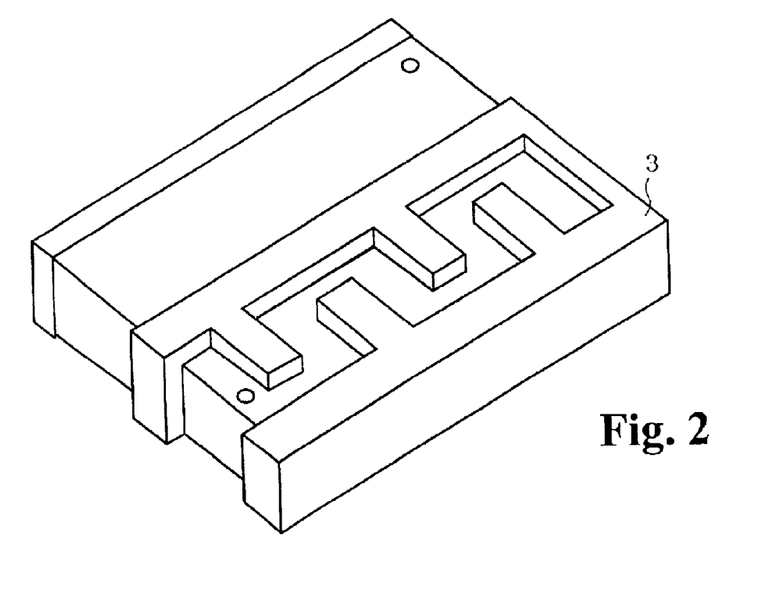
FIG. 2 is a perspective view of a base shown in FIG. 1(A) on which a coating material is applied.

The surface-roughed base 1 was set in a secondary mold kept at 10° C. (generally at 5 to 30° C.), while a water soluble polymer (polyvinyl alcohol (hereinafter referred to as PVA) "POVAL"®, available from KURAREY Co., Ltd.) as a coating material 3 was heated to 190° C. (generally at 150 to 260° C.) and injected into the secondary mold at an injection pressure of 350 kg/cm² (generally 200 to 1200 kg/cm²) to form molded articles partially coated by the coating material 3 as shown in FIG. 2 (perspective view).

The coating material 3 on these molded articles were 1 mm and 0.5 mm in thickness, respectively.

[Plating Catalyst Applying Process and Coating Material Removing Process]

A plating bath was prepared by adding a mixed hydrochloric acid solution with stannous chloride and palladium chloride as a plating catalyst salt ("ENILEX CT-8"®, available from EBARA-UDYLITE Co., Ltd.) to methyl alcohol in an ratio of 20 ml/l, and kept at 30° C. A plurality of molded articles, which were partially coated as described above, were put in the barrel-like container, soaked in the thus prepared plating bath for 4 minutes (generally 3 to 5 minutes) while rotating, washed with water and soaked in a solution containing hydrochloric acid in a ratio of 50 ml/l at 60° C. for 60 minutes as an accelerator treatment to apply the plating catalyst on the molded article except the partially coated surface and, at the same time to conduct a process for eluting and removing the coating material 3.

Application of plating catalyst and removal of the coating material 3 were conducted simultaneously and satisfactorily in both cases of materials of 1 mm and 0.5 mm in thickness.

[Plating Process]

After the coating material 3 was removed, a plurality of bases 1 still set in the barrel-like container were soaked in a copper plating bath of composition as shown in Table 1 while rotating the container and subjected to electroless copper plating under a plating condition as shown in Table 2, followed by an annealing treatment while keeping them at 170° C. for 1 hour and then slowly cooling to room temperature. As a result, bases 1 plated thereon in thickness of 10 μm (generally 0.3 to 20.0 μm) were obtained as shown in FIG. 3.

On the other hand, a plurality of bases were subjected to electroless copper plating to form a plated layer of 0.5 μm in thickness and further subjected to copper electroplating to form a layer of 0.5 μm in thickness, followed by the above mentioned annealing treatment while setting them in the barrel-like container. Here again, similar product was obtained.

Figure 3:
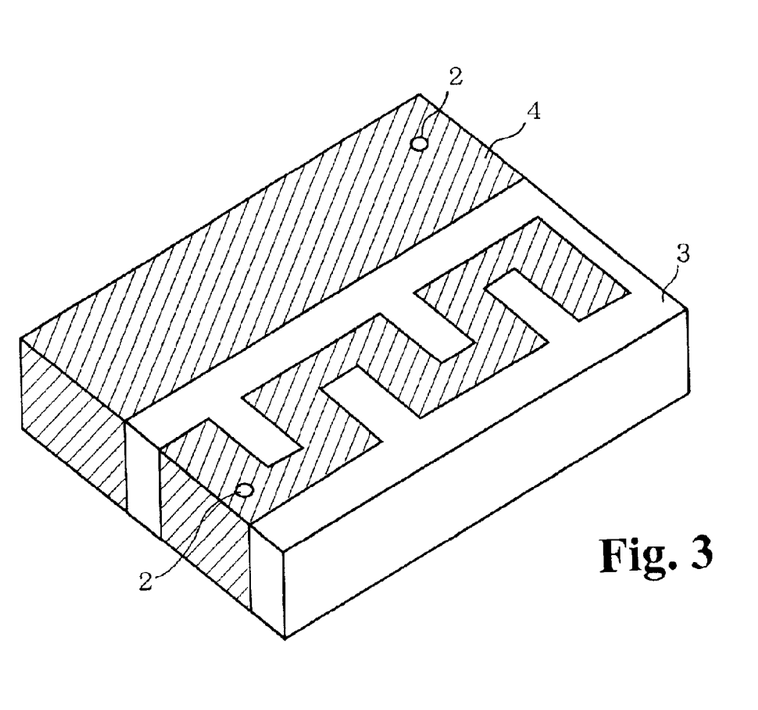
FIG. 3 is a perspective view of a base shown in FIG. 1(A) on which electroless plating is applied.

Numeral 4 designates a copper-plated portion as shown in FIG. 3. The copper-plated portion 4 was located only on a part of surface where the plating catalyst was applied, or the remainder of surface except an area coated by the coating material 3 as shown in FIG. 2, and an inner surface of through holes 2.

TABLE 1

| Copper plating composition | |
|---|---|
| $CuSO_4.5H_2O$: | 0.04 mol/l |
| HCHO: | 0.1 mol/l |
| NaOH: | 0.2 mol/l |
| EDTA.4Na | 0.08 mol/l |
| α, α-dipyridyl: | 5 to 10 ppm |
| PEG-1000[*1]: | 50 to 100 ppm |

[*1]PEG 1000 is a trade name of stabilizing agent available from EBARA = UDYLITE Co., Ltd.

TABLE 2

| Plating condition | |
|---|---|
| bath temperature: | 60 to 70° C. |
| air stirring: | 0.1 l/l · min. |
| bath stirring: | 0 to 1 dm$^2$/l |

COMPARATIVE EXAMPLE 1

[Base Molding Process]

Figure 4:
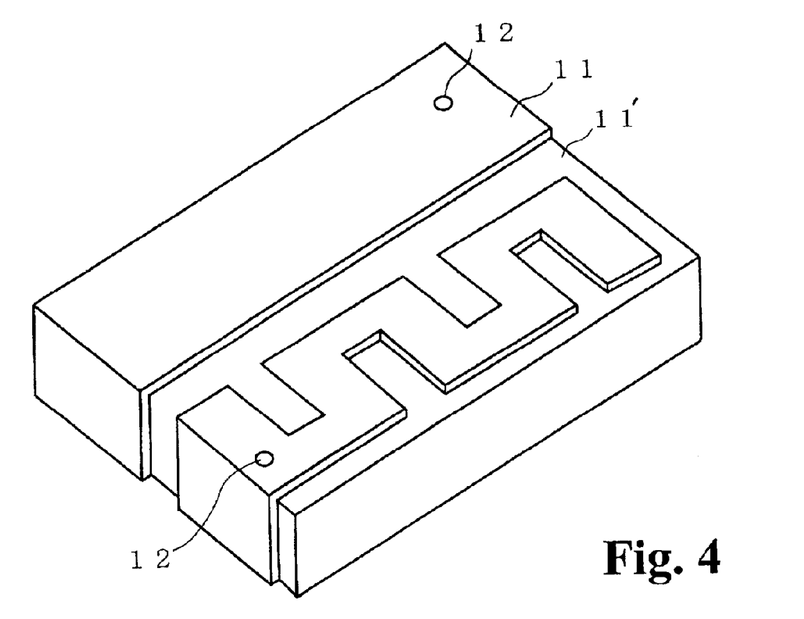
FIG. 4 is a perspective view of a comparative base.

A base (single base) 11 of a shape as shown in FIG. 4 was molded in a similar manner as described in Example 1. Numerals 11' and 12 designate a concave portion of the base 11 and through holes, respectively.

[Base Surface Roughing Process]

The base 11 was roughed in a similar manner as described in Example 1.

[Plating Catalyst Applying Process]

A plating bath was prepared by mixing the same plating catalyst used in Example 1 ("ENILEX CT-8" ®, available from EBARAUDYLTE Co., Ltd.) in a ratio of 20 ml/l with 150 ml/l-concentrated sulfuric acid and was kept at 30° C. Similarly as described in Example 1, primarily molded and surface-roughed articles 11 were soaked in the thus prepared bath for 3 minutes, washed with water, which were then soaked in an accelerator solution containing sulfuric acid of 80 ml/l-concentration at 50° C. for 4 minutes and washed with water to apply the plating catalyst throughout the surface of these bases.

[Base Coating Process]

Figure 5:
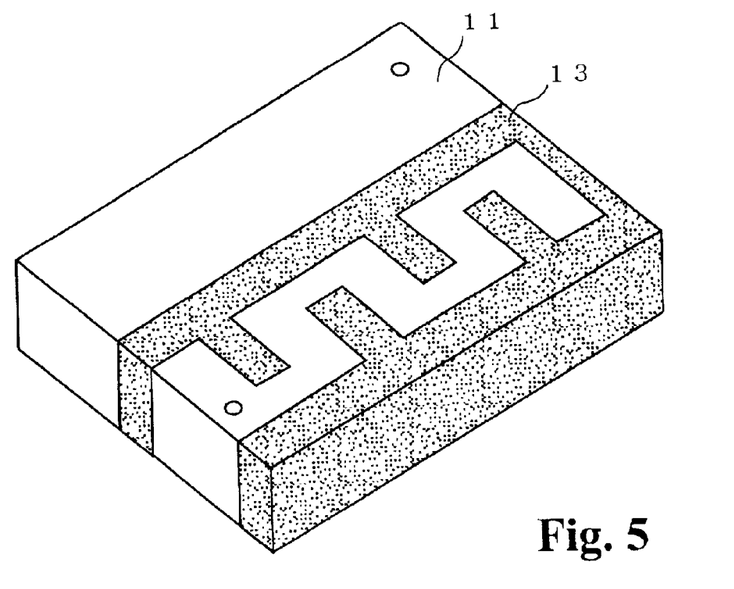
FIG. 5 is a perspective view of a comparative base shown in FIG. 4, on which a coating material is applied.

The catalyst-applied base 11 was set in a secondary mold and coated with the same resin as the base 11 to form a partially coated article as shown in FIG. 5. The coating material 13 comprising the same material as the base is formed on the concave portion 11' shown in FIG. 4.

[Plating Process]

The partially coated article were plated by electroless copper plating in a similar manner as described in Example 1.

It was visually observed that the periphery of plating catalyst applied surface between the base 11 and the coating material 13 is exposed and Cu-plated due to their imperfect adhesion.

EXAMPLE 2

[Base Molding Process]

A base 1 was molded in a similar manner as described in Example 1.

[Base Surface Roughing Process]

The base 1 was roughed in a similar manner as described in Example 1.

[Base Coating Process]

The surface-roughed base was set in a secondary mold kept at 10° C. (generally at 5 to 30° C.), while a hydrolyzable polymer (a polylactate resin LACEA®, available from Mitsui Chemical Co., Ltd.) as a coating material 3 was heated to 190° C. (generally at 150 to 260° C.) and injected into the secondary mold at an injection pressure of 350 kg/cm$^2$ (generally 200 to 1200 kg/cm$^2$) to form molded articles partially coated by the coating material 3 as shown in FIG. 2 (perspective view).

[Plating Catalyst Applying Process]

A plating bath was prepared by adding the same plating catalyst used in Example 1 ("ENILEX CT-8"®, available from EBARAUDYLITE Co., Ltd.) in an ratio of 20 ml/l to water, followed by addition of HCl in a ratio of 150 ml/l thereto and was kept at 30° C. Similarly as described in Example 1, the molded and partially covered articles 1 were soaked in the thus prepared bath for 4 minutes (generally for 3 to 5 minutes), washed with water, which were then soaked in a 8-% hydrochloric acid solution (generally 5 to 10% solution) at 30° C. for 4 minutes as an accelerator treatment to apply the plating catalyst to the molded article except the surface partially covered with the covering material 3.

[Coating Material Removing Process]

The plating catalyst applied bases 1 were soaked in aqueous NaOH of 7% by weight-concentration at 30° C. for 40 minutes to remove the coating material 3.

Similarly as described in Example 1, application of plating catalyst and removal of the coating material 3 were conducted simultaneously and satisfactorily in both cases of materials of 1 mm and 0.5 mm in thickness.

[Plating Proces]

The partially coated article were plated by electroless copper plating in a similar manner as described in Example 1.

Further, similarly as described in Example 1, the molded and partially coated articles were plated by Cu-electroplating after the above mentioned electroless plating.

The copper-plated portion 4 was located only on a part of surface where the plating catalyst was applied, or the remainder of surface except an area coated by the coating material 3 as shown in FIG. 2, and an inner surface of through holes 2.

EXAMPLE 3

[Base Molding Process]

A base 1 was molded in a similar manner as described in Example 1.

[Base Coating Process]

The molded base 1 was set in a secondary mold to which a hydrolyzable resin was injected in a similar manner as described in Example 2 to form a partially coated article similar to that of Example 1.

[Base Surface Roughing Process]

The partially coated article was soaked in a 50% (concentration)-dimethylfolmamide solution (generally concentration of 60 to 80%) at 50° C. (generally at 35 to 60° C.) for 60 minutes (generally for 5 to 120 minutes) in a similar manner as described in Example 1 to swell the base surface except a portion coated with the coating material 3, which was then washed with water and soaked in a mixture of concentrated sulfuric acid in a ratio of 600 cm$^3$/dm$^3$, 89%-phosphoric acid in an ratio of 100 cm$^3$/dm$^3$ and chromic acid in an ratio of 30 g/dm$^3$ at 70° C. (generally at 70 to 75° C.) for 70 minutes (generally for 30 to 120 minutes) to rough the swelled portion.

[Plating Catalyst Applying Process]

A plating bath was prepared by adding a solution of palladium chloride in a ratio of 30 ml/l as a plating catalyst salt (available from OKUNO CHEMICAL INDUSTRIES Co., Ltd.) to ethyl alcohol. The surfaced-roughed articles were soaked in the thus prepared bath at 60° C. (generally at 50 to 90° C.) for 60 minutes (generally for 5 to 100 minutes) and then washed with water in a similar manner as described in Example 1 to apply the plating catalyst to the roughed surface except a portion coated with the coating material 3.

[Coating Material Removing Process]

The plating catalyst applied articles were soaked in 5%-aqueous sodium hydroxide (generally concentration of 5 to 20%) at 50° C. (generally 20 to 80° C.) for 60 minutes (generally for 40 to 80 minutes) in a similar manner as described in Example 1 to hydrolyze the coating material 3.

[Plating Process]

The hydrolyzed articles were plated by electroless copper plating to form a copper-plated portion 4 in a similar manner as described in Example 1.

The copper-plated portion 4 was located only on the surface except an area coated by the coating material 3 and an inner surface of through holes 2 similarly as in the case of Example 1.

EXAMPLE 4

[Base Molding Process]

A base 1 was molded in a similar manner as described in Example 1.

[Base Surface Roughing Process]

The base 1 was roughed throughout the surface in a similar manner as described in Example 1.

[Plating Catalyst Applying Process]

A plating catalyst was applied to the base surface thoroughly in a similar manner as described in Example 1.

[Plating Process]

An electroless copper plating process was conducted to form a Cu-plated layer of 5 μm thick in a similar manner as described in Example 1 except conducting the annealing treatment.

[Base Coating Process]

The plated base was coated with the same hydrolyzable resin as that of used in Example 2 in a similar manner as described in Example 1 to form a partially covered article, thereby a portion to be plated being covered.

[Plated Layer Removing Process]

After the coating process, the molded article was soaked in a 40 wt. %-solution of ferric chloride or cupric chloride (generally 28 to 42% by weight) in a similar manner as described in Example 1 to remove the plated layer on the uncoated surface.

[Coating Material Removing Process]

The coating material was removed by hydrolyzation in a similar manner as described in Example 2, followed by the annealing treatment of Example 1.

EXAMPLE 5

[Base Molding Process]

A base 1 was molded in a similar manner as described in Example 1.

[Base Surface Roughing Process]

The base 1 was roughed throughout the surface in a similar manner as described in Example 1.

[Plating Catalyst Applying Process]

A plating catalyst was applied to the base surface thoroughly in a similar manner as described in Example 1.

[Base Coating Process]

The base was coated with the same hydrolyzable resin as that of used in Example 2 in a similar manner as described in Example 1 to form a partially covered article.

[Plating Process]

An electroless copper plating process was conducted to form a Cu-plated layer of 1 to 5 μm thick in a similar manner as described in Example 1 except conducting the annealing treatment.

[Coating Material Removing Process]

The coating material was hydrolytically removed by soaking the coated base in a 4 to 25%-aqueous sodium hydroxide at 60 to 90° C. for 1 to 3 hours in a similar manner as described in Example 1.

[After-plating Process]

The electroless Cu-plated article was further subjected to an electroless Cu-plating process in a similar manner as described in Example 1 to form a plated layer of 1 to 20 μm thick.

EXAMPLE 6

A procedure of Example 4 was repeated except that PVA was used as the coating material and the base was plated by treating in a tetrahydrofuran solution of aluminum chloride and lithium aluminum hydroxide to form an aluminum plated layer of 2 μm thick (generally 0.5 to 2.5 μm thick) on the base surface.

EXAMPLE 7

[Base Molding Process]

Figure 6:
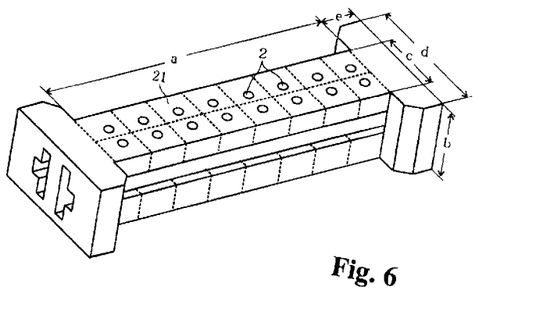
FIG. 6 is a perspective view of an assembly of bases according to another example of the present invention.

Bases assembly (assembled bases) 21 was molded from aromatic polyester (liquid crystal polymer "VECTRA C810"®, available from CELANESE Co., Ltd.) by means of a primary mold as shown in FIG. 6 (perspective view).

Outer dimensions of the base assembly 21 are a=40 mm, b=5 mm, c=4 mm, d=7 mm and e=7 mm, respectively, while a plurality of through holes 2 are formed along straight lines on the upper surface.

A plurality of base assembly 21 was put in a perforated barrel-like container made of polypropylene and soaked in a heated degreasing solution (a 50 g/l-aqueous solution of "ACECLEAN A220"®, available from OKUNO CHEMICAL INDUSTRIES Co., Ltd.) at 60° C. for 10 minutes while rotating the container and then washed with water to degrease them.

[Base Surface Roughing Process]

An alkaline solution prepared by dissolving 430 g of metallic Na in 1 l of methyl alcohol was heated to 90° C., in which a plurality of degreased bases 1 kept in the barrel-like container were soaked for 40 minutes while rotating to rough the surface of base assembly 21.

Roughed bases 1 were also obtainable when ethyl alcohol was used instead of methyl alcohol together with 430 g of metallic Na under the same condition.

When isopropyl alcohol was used instead of methyl alcohol together with 430 g of metallic Na, a plurality of degreased base assembly 21 kept in the barrel-like container were soaked in the thus prepared solution at 60° C. for 10 minutes and then in a chromic acid mixture comprising 22% by weight of $CrO_3$ and 54% by weight of concentrated sulfuric acid at 60° C. while rotating, respectively, to rough the base surface.

Further, when there was used an alkaline solution prepared by dissolving 400 g of NaOH (generally in an amount of 350 to 500 g) in 1 l of water, roughed bases 1 were also obtainable under the same condition as described above in the case of methyl alcohol.

Base Coating Process

Figures 7A, 7B:
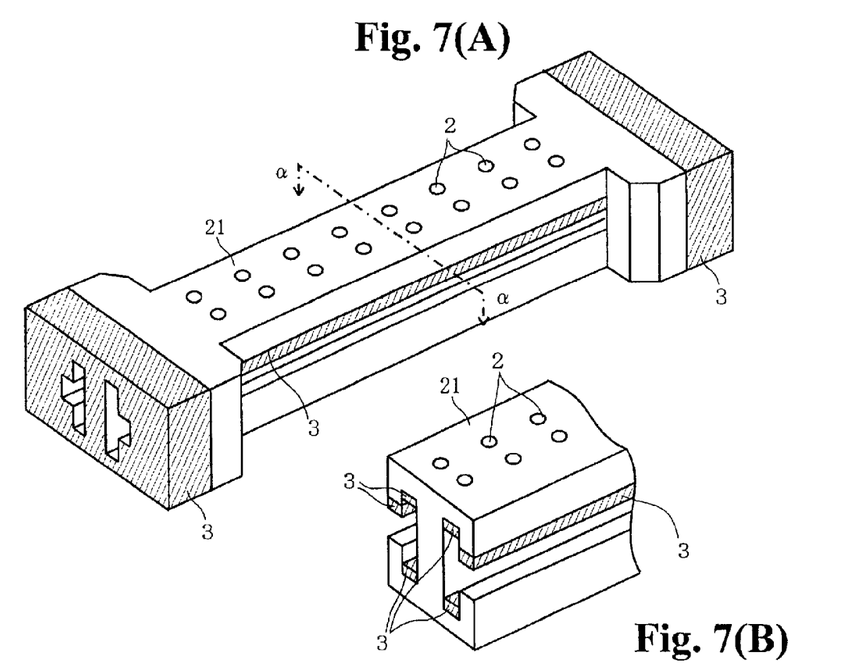
Figure 7C:
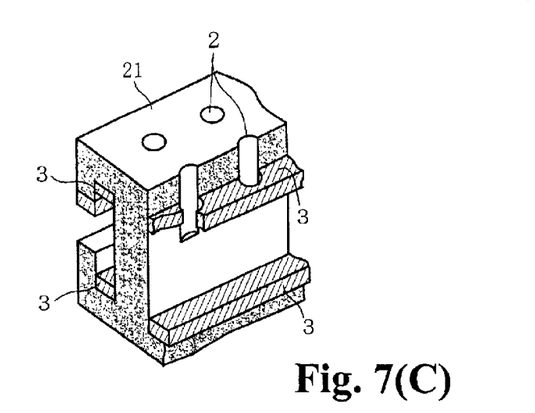

The surface-roughed base 1 was set in a secondary mold kept at 10° C., while a hydrolyzable polymer (a polylactate resin LACEA®, available from Mitsui Chemical Co., Ltd.) as a coating material 3 was heated to 190° C. and injected into the secondary mold at an injection pressure of 350 kg/cm² (generally 200 to 1200 kg/cm²) to form molded articles partially coated by the coating material 3 as shown in FIGS. 7(A)–7(C), in which FIG. 7(A) is a perspective view on the whole, FIG. 7(B) is a sectional illustration taken along line 7(B)–7(B) in FIG. 7(A) and FIG. 7(C) is a partially cutaway view of FIG. 7(B), respectively.

The coating material 3 on these molded articles were 1 mm and 0.5 mm in thickness, respectively.

[Plating Catalyst Applying Process and Coating Material Removing Process]

A plating bath was prepared by adding a mixed hydrochloric acid solution with stannous chloride and palladium chloride as a plating catalyst salt ("ENILEX CT-8"®, available from EBARA-UDYLITE Co., Ltd.) to methyl alcohol in a ratio of 20 ml/l, and kept at 30° C. A plurality of molded articles, which were partially coated as described above, were put in the barrel-like container, soaked in the thus prepared plating bath for 4 minutes while rotating, washed with water and soaked in a solution containing hydrochloric acid in a ratio of 50 ml/l at 60° for 60 minutes as an accelerator treatment to apply the plating catalyst on the molded article except the partially coated surface and, at the same time to conduct a process for eluting and removing the coating material 3.

Application of plating catalyst and removal of the coating material 3 were conducted simultaneously and satisfactorily in both cases of materials of 1 mm and 0.5 mm in thickness.

[Plating Process]

After the coating material 3 was removed, a plurality of base assemblies 21 still set in the barrel-like container was soaked in a preliminary copper plating bath of composition as shown in Table 3 while rotating the container and subjected to electroless copper plating under a plating condition as shown in the same Table to form a plated layer of 1 μm thick (generally 0.5 to 1.5 μm). The thus preliminarily plated base assemblies were further soaked in a main copper plating bath of composition as shown in Table 4 under a plating condition as shown in the same Table while rotating the container to form a plating layer of 9 to form a plated layer of 9 μm thick (generally 9.5 to 8.5 μm) on the preliminary layer, total thickness thereof being 10 μm.

After the above mentioned Cu-plating process, there may be conducted an after-plating process such as electroless Ni- or Au-plating, or electric Ni- or Au-plating, followed by an annealing treatment as the final process in a similar manner as described in Example 1.

Figure 8:
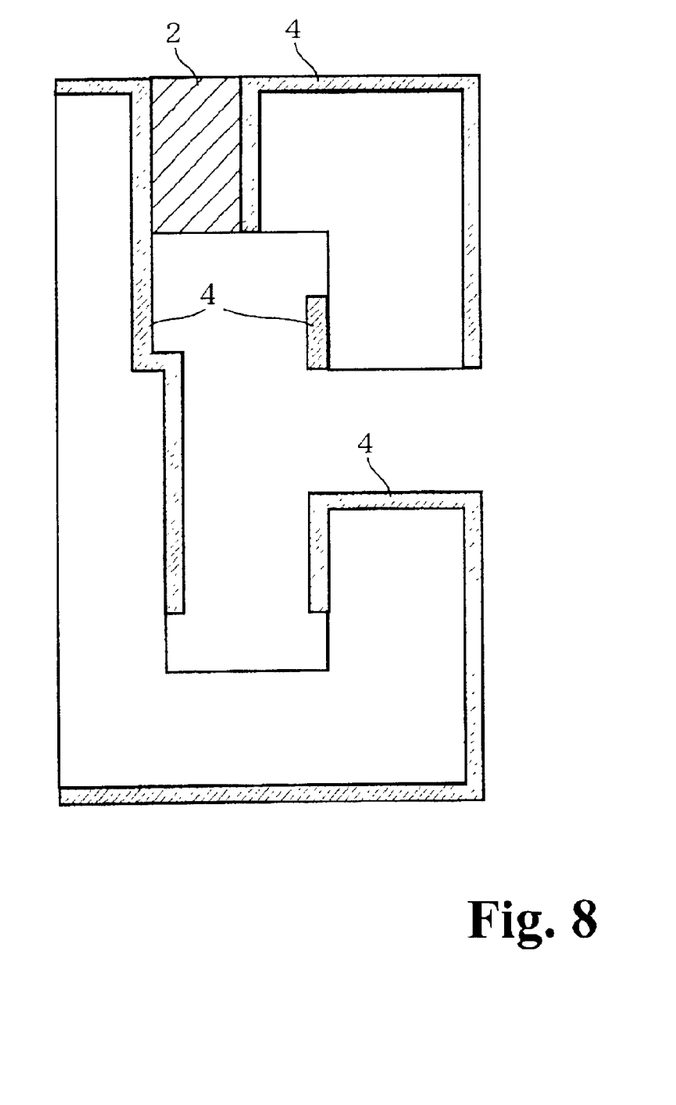
FIG. 8 is a partially sectional view of a covered assembly on which plating is applied.

FIG. 8 illustrates plated portions on the base surface obtained by this example. Numeral 4 designates Cu-plated, or further after-Ni- or Au-plated portions on which the plating catalyst has been applied. It was observed that these portions 4 were located only on the surface except an area coated with the coating material 3 as shown in FIGS. 7(A) to 7(C) and an inner surface of through hole 2.

TABLE 3

Composition of preliminary Cu-plating bath and plating condition

| | |
|---|---|
| CuSO$_4$.5H$_2$O: | 0.04 mol/l |
| HCHO (37%-solution): | 0.3 mol/l |
| NaOH: | pH 12.2 |
| EDTA.4Na: | 0.10 mol/l |
| stabilizing agent[*1]: | a little |
| bath temperature: | 35° C. |

[*1]metal ion stabilizing agent

TABLE 4

Composition of main Cu-plating bath and plating condition

| | |
|---|---|
| CuSO$_4$.5H$_2$O: | 0.04 mol/l |
| HCHO (37%-solution): | 0.06 mol/l |
| NaOH: | pH 12 |
| EDTA.4Na: | 0.1 mol/l |
| stabilizing agent[*1]: | a little |
| bath temperature: | 65° C. |
| plating speed: | 2.5 μm/hr |

Figure 9:
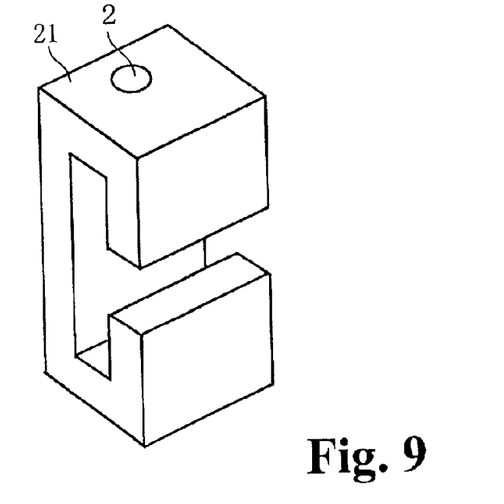
FIG. 9 is a perspective view of a chip part produced by cutting a plated assembly shown in FIG. 8.

The base assembly 21 used in Example 7 was partially coated with coating material 3 as shown in FIGS. 7(A) to 7(C) and subjected to a plating process similarly as described in Example 3 using the compositions of preliminary and main plating bath under the plating conditions as shown in Tables 3 and 4 in Example 7, respectively, which was then cut off in a similar manner as described in Example 7 to form chip parts having a shape of FIG. 9 (perspective view)

Example 9

The base assembly 21 used in Example 7 was partially coated with coating material 3 as shown in FIGS. 7(A) to 7(C) and subjected to a plating process similarly as described in Example 4 using the compositions of preliminary and main plating bath under the plating conditions as shown in Tables 3 and 4 in Example 7, respectively, which was then cut off in a similar manner as described in Example 7 to form chip parts having a shape of FIG. 9 (perspective view)

Example 10

The base assembly 21 used in Example 7 was partially coated with coating material 3 as shown in FIGS. 7(A) to 7(C) and subjected to a plating process similarly as described in Example 5 using the compositions of preliminary and main plating bath under the plating conditions as shown in Tables 3 and 4 in Example 7, respectively, which was then cut off in a similar manner as described in Example 7 to form chip parts having a shape of FIG. 9 (perspective view).

EXAMPLE 11

A procedure of Example 9 was repeated except that the assembly 21 was coated with PVA as a coating material and plated by treating thereof with aluminum chloride and lithium hydroxide in a tetrahydrofurn solution to form a Al-plated layer of 2 μm thick (generally 0.5 to 2.5 μm thick) thereon.

What is claimed is:

1. A method for partially plating on a base, comprising:

a roughing process to rough a base surface of the base, a coating process to partially coat a coating material selected from the group consisting of a water soluble polymer and hydrolyzable polymer on a predetermined coating area in a roughed surface of the base, a catalyst applying and coated material removing process to apply a plating catalyst on the base surface except a coated portion with the coating material and to remove the coating material applied on the base, simultaneously, a plating process to plate on a catalyst applied surface.

2. A method for partially plating on a base as claimed in claim 1, wherein the base is cut to a number of base portions.

3. A method for partially plating on a base as claimed in claim 1, wherein said coating material is polylactate or a mixture or copolymer of polylactate as a main component with aliphatic polyester.

4. A method for partially plating on a base, comprising:

a coating process to partially coat a coating material selected from the group consisting of a water soluble polymer and hydrolyzable polymer on a predetermined coating area of the base, a roughing process to rough a surface of the base except a coated portion with the coating material, a catalyst applying and coated material removing process to apply a plating catalyst on a roughed surface and to remove the coating material applied on the base, simultaneously, and a plating process to plate on a catalyst applied surface.

5. A method for partially plating on a base as claimed in claim 4, wherein the base is cut to a number of base portions.

6. A method for partially plating on a base as claimed in claim 4, wherein said coating material is polylactate or a mixture or copolymer of polylactate as a main component with aliphatic polyester.

* * * * *